United States Patent
Wang et al.

(10) Patent No.: US 8,614,585 B2
(45) Date of Patent: Dec. 24, 2013

(54) IMPEDANCE CORRECTION DEVICE AND METHOD THEREOF

(75) Inventors: Wen-Shan Wang, Tainan County (TW); Ting-Ying Wu, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 292 days.

(21) Appl. No.: 13/019,020

(22) Filed: Feb. 1, 2011

(65) Prior Publication Data

US 2011/0193568 A1 Aug. 11, 2011

(30) Foreign Application Priority Data

Feb. 5, 2010 (TW) .............................. 99103568 A

(51) Int. Cl.
 *G01R 27/28* (2006.01)
 *G01V 3/00* (2006.01)
 *G01R 27/08* (2006.01)
 *H03K 17/16* (2006.01)
 *H04B 15/00* (2006.01)

(52) U.S. Cl.
 USPC ............. 324/649; 324/322; 324/710; 326/30; 375/285

(58) Field of Classification Search
 USPC ........................................................ 324/649
 See application file for complete search history.

(56) References Cited

U.S. PATENT DOCUMENTS

| | | | | |
|---|---|---|---|---|
| 4,970,466 A | * | 11/1990 | Bolles et al. | 324/533 |
| 5,057,783 A | * | 10/1991 | Gubisch | 324/710 |
| 6,140,885 A | * | 10/2000 | Abadeer et al. | 333/17.3 |
| 8,098,076 B2 | * | 1/2012 | Chen et al. | 324/754.07 |
| 8,274,307 B1 | * | 9/2012 | Ben Artsi | 326/30 |
| 2006/0033499 A1 | * | 2/2006 | Flexman et al. | 324/322 |
| 2008/0123771 A1 | * | 5/2008 | Cranford et al. | 375/285 |

FOREIGN PATENT DOCUMENTS

| | | |
|---|---|---|
| TW | 200506955 A | 2/2005 |
| TW | 200939621 A | 9/2009 |
| TW | 201006143 A | 2/2010 |

OTHER PUBLICATIONS

Mark D. Tilden, Measuring Controlled-Impedance Boards with TDR, Copyright 1992, Tektronix, Inc., and Printed Circuit Fabrication, Feb. 1992, Copyright 1992, Miller Freeman Inc.*

* cited by examiner

*Primary Examiner* — Jermele M Hollington
*Assistant Examiner* — Christopher McAndrew
(74) *Attorney, Agent, or Firm* — Muncy, Geissler, Olds & Lowe, PLLC

(57) ABSTRACT

An impedance correction device and a method thereof are provided. A step generator is used to generate a step signal and send to a circuit under test. A reflected signal returned back from the circuit under test is used as a measurement signal; and the measurement signal can be measured to obtain a characteristic impedance value. When the measurement signal is greater than the initially measured step signal, an impedance value of a correction resistor is increased; when the measurement signal is smaller than the initially measured step signal, the impedance value of the correction resistor is reduced. Through adjustment of the correction impedance value, impedance matching between the correction impedance value and the characteristic impedance value is achieved.

16 Claims, 6 Drawing Sheets

IMPEDANCE CORRECTION DEVICE AND METHOD THEREOF

CROSS-REFERENCES TO RELATED APPLICATIONS

This non-provisional application claims priority under 35 U.S.C. §119(a) on Patent Application No. 99103568 filed in Taiwan, R.O.C. on Feb. 5, 2010, the entire contents of which are hereby incorporated by reference.

BACKGROUND OF THE INVENTION

1. Technical Field

The present invention relates to impedance correction, and more particularly to an impedance correction device and a method thereof.

2. Related Art

Currently, an impedance of a high-speed transmission interface on the market is usually defined with a certain value, so that designers can pre-design the output capability of a similar impedance value, thereby matching impedances, reducing reflected waves, and reducing noise. However, most designs of the transmission interface on the market only take into consideration such factors as process shift, difference of external voltage, and change of environmental temperature, without considering the possible influence caused by a circuit board itself.

FIG. 1 is a conventional technology of impedance correction. Within a circuit, a precision resistor Rref is generally designed outside an integrated circuit, and is connected to ground VSSQ. An internal resistor R is connected to a power supply VDDQ. The voltage at a point 6 can be obtained through the principle of voltage division. The voltage at the point 6 is the same as the voltage at a point 5. Comparing with the voltage at a point 4 of a working circuit 1, if the voltage at the point 5 is smaller than a comparison voltage Vcomp at the point 4, a comparator 3 will output the voltage difference to a control circuit 2, which will output a control signal to reduce the resistance of the internal resistor R. On the contrary, if the voltage at the point 5 is greater than the comparison voltage Vcomp at the point 4, the control circuit outputs another control signal to increase the resistance of the internal resistor R. Thus, impedance matching can be achieved by adjusting the impedance value of the internal resistor R.

The conventional technology requires the installation of a precision resistor outside the integrated circuit, which is costly and cannot appropriately handle the possible influence caused by the impedance value of paths on the circuit board.

SUMMARY

In order to resolve the technical problems in the conventional technology, a proposed impedance correction device includes a driving unit, a step signal generator, a reference impedance, a detection unit, an impedance calculation unit, and an impedance setting unit. The step signal generator generates a step signal. The reference impedance has a fixed impedance value, and has one end coupled to the step signal generator and the other end coupled to a circuit under test. The detection unit is coupled to the other end of the reference impedance, and is used for detecting the step signal passing through the reference impedance and a measurement signal of the step signal returned after passing through the circuit under test. The impedance calculation unit is coupled to the detection unit, and is used for calculating a characteristic impedance value of the circuit under test according to the step signal and the measurement signal. The impedance setting unit is coupled to the impedance calculation unit, and is used for adjusting an impedance value of a correction impedance of the driving unit according to the characteristic impedance value, so as to match the characteristic impedance value.

The present invention further provides an impedance correction method which includes the following steps: providing a reference impedance and a correction impedance, in which the correction impedance is adjustable; generating a step signal and applying the step signal to a circuit under test through the reference impedance; detecting the step signal and a measurement signal returned by the circuit under test; calculating a characteristic impedance value of the circuit under test according to the step signal and the measurement signal; and adjusting an impedance value of the correction impedance according to the characteristic impedance value, so as to match the characteristic impedance value.

BRIEF DESCRIPTION OF THE DRAWINGS

The present invention will become more fully understood from the detailed description given herein below and the accompanying drawings for illustration only, and thus are not limitative of the present invention, and wherein.

DETAILED DESCRIPTION

The present invention uses the principle of Time Domain Reflectometry (TDR) to provide a circuit with corresponding values of an incident wave and a reflected wave, and then perform correction of an internal impedance value according to the corresponding values.

A general TDR instrument includes a step signal generator, a voltage detector/processor, and a display. The TDR instrument performs measurement at a point under test through a step signal generated by the step generator. The step signal is transmitted to the voltage detector/processor through a path, and a reflected signal of the step signal passing through an object under test may pass through the path and be transmitted to the voltage detector/processor.

The display can display the signal detected by the voltage detector/processor, and display the calculation of an impedance value of the object under test by the voltage detector/processor.

The measurement result is calculated according to a reflection coefficient $\Gamma$. The reflection coefficient $\Gamma=(Z_L-Z_0)/(Z_L+Z_0)=V_r/V_i$, where $V_m=V_r+V_i=(1+\Gamma)V_i$, $Z_L$ is the impedance value of the object under test, and $Z_0$ is an impedance value of a reference impedance. Therefore, the following equation can be obtained:

$$Z_L=Z_0*V_m/(2V_i-V_m) \quad \text{Equation 1}$$

Where $V_m$ is a voltage value measured at a point P2 at time t=t, and is a sum of voltages of the incident wave and the reflected wave; $V_i$ is the voltage value of the incident wave measured at the point P2 when t=0; and $V_r$ is the voltage value of the reflected wave, namely, $V_r = V_m - V_i$. Since the voltage value measured at time t, $V_m$, is a sum of the voltage values of the incident wave $V_i$ and the reflected wave $V_r$, the measured impedance value $Z_L$ can be calculated directly from the measured voltage values and based on Equation 1.

TDR measurement technology is a quite mature technical field. However, TDR measurement technology is applied through measurement by instruments outside the circuit, and is used in the phase of product development. The use of the TDR measurement technology in the phase of mass production will result in high labor costs for measurement.

The embodiments of the present invention use the measurement principle of TDR in an integrated circuit, which is different from the previously mentioned measurement by instrument. Two embodiments of the present invention perform correction of an impedance value using the measurement principle of TDR, which are respectively a comparator method and an analog-to-digital converter method; a detailed description of which follows.

Figure 1:
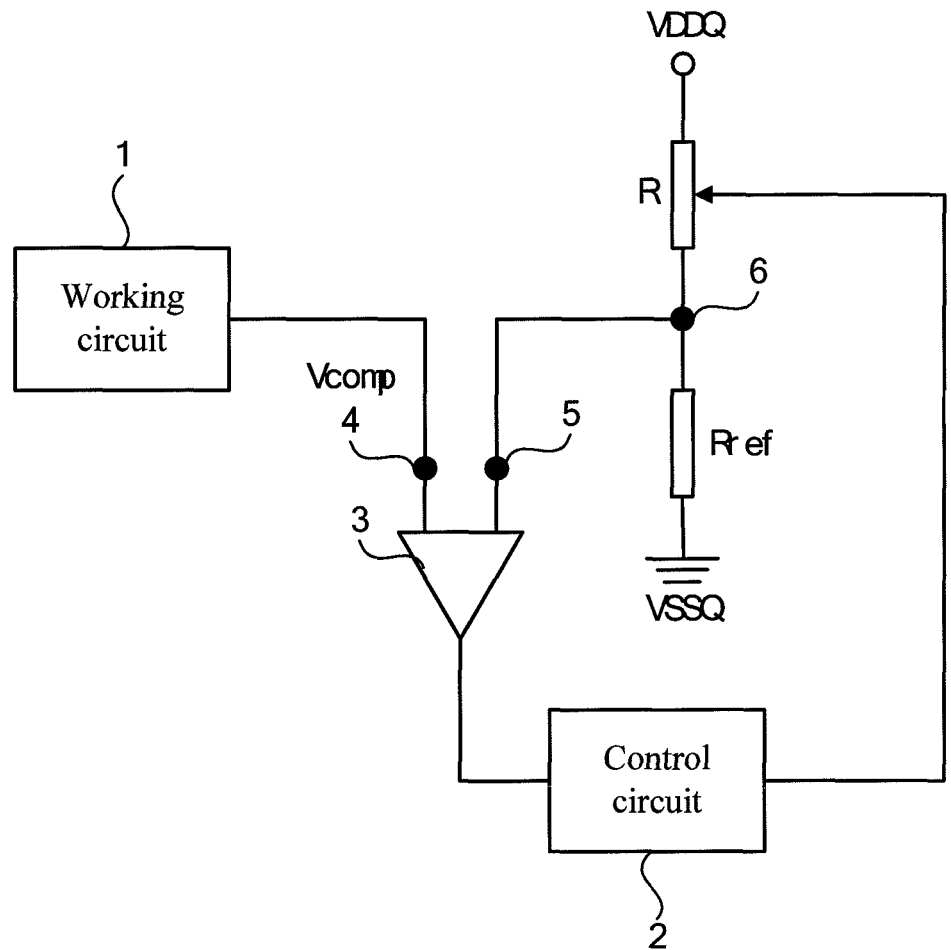
FIG. 1 is a circuit diagram of a conventional impedance correction technology.
Figure 2:
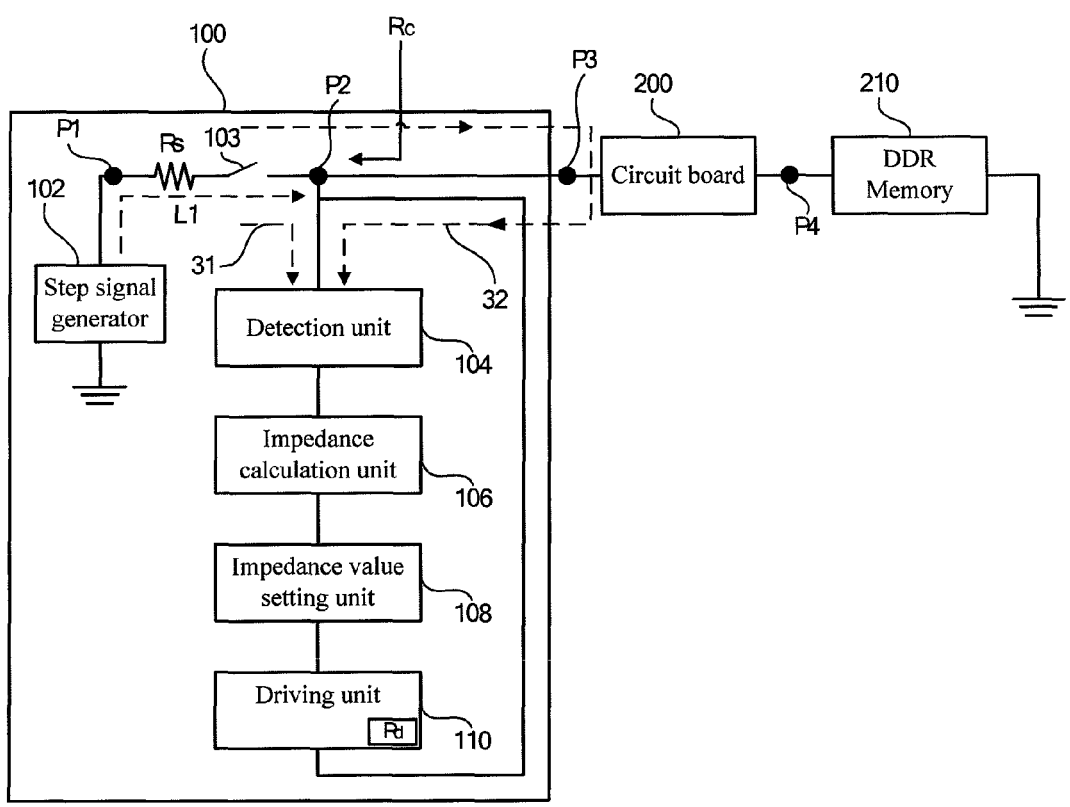
FIG. 2 is a functional block diagram of an impedance correction device according to an embodiment of the present invention.

FIG. 2 is a functional block diagram of an impedance correction device 100 according to an embodiment of the present invention. The impedance correction device 100 is applied within an integrated circuit, and includes a step signal generator 102, a detection unit 104, an impedance calculation unit 106, an impedance setting unit 108, a driving unit 110, and a reference impedance Rs. The step signal generator 102 is used for generating a step signal for measurement. The step signal generator 102 is connected to the reference impedance Rs through a first path L1, namely from the step signal generator 102 to a point P2. A point P1 has a voltage value of the step signal sent by the step signal generator 102, and the point P2 is a measurement point. At time t=0, a voltage value of an incident wave measured at the point 2 is $V_i$; and at t=t1, the voltage value of the incident wave measured at the point 2 is $V_m$. The detection unit 104 is connected to another end of the reference impedance Rs, and is coupled to a circuit board 200 at a point P3. The external circuit board 200 is coupled to a double date rate (DDR) memory 210 of a first embodiment at a point P4. The detection unit 104 is a comparator or an analog-to-digital converter. The comparator compares different signals ($V_i, V_m$) and generates a comparison signal, while the analog-to-digital converter can output digital values of the two voltages ($V_i, V_m$), which is easier for quantization.

If the detection unit 104 uses the comparator to generate the comparison signal, the comparator compares measurement signal values at the point P2 at different time points. For example, the voltage value $V_i$ measured at the point P2 at t=t0 when the step signal is passing through a path 31, is compared with a sum of the voltage value $V_i$ and a reflected voltage value $V_r$ measured at t=t1, namely $V_m$, when the step signal is passing through a path 32. The detection unit 104 generates the comparison signal using a voltage difference between $V_i$ and $V_m$, and outputs the comparison signal to the impedance calculation unit 106. The impedance calculation unit 106 can calculate an impedance value of the circuit board 200 based on Equation 1, and transmits the impedance value to the impedance setting unit 108, in which the impedance value of the Rs is $Z_0$, and the impedance value of the circuit board 200 is also referred to as a characteristic impedance value $Z_L$. The impedance setting unit 108 is coupled to the impedance calculation unit 106 to adjust an impedance value of a correction impedance Rd of the driving unit 110 according to the characteristic impedance value $Z_L$, so as to match the characteristic impedance value $Z_L$.

The impedance value of an equivalent impedance Rc is an equivalent impedance value in view of the point P2. In order to ensure the impedance value of the equivalent impedance Rc in view of the point P2 is substantially equal to the impedance value of the correction impedance Rd, the influence of the reference impedance Rs on the circuit may be omitted. In other words, after the step signal generator 102 generates the step signal, the reference impedance Rs is isolated by opening a specific switch of the impedance correction device. In an embodiment, the impedance correction device 100 further includes a switch 103; after the correction impedance Rd is matched with the characteristic impedance value $Z_L$, the switch 103 is open, so that the first path L1 is open-circuited, thereby isolating the influence of the reference impedance Rs.

More specifically, after the characteristic impedance value $Z_L$ is calculated, if the characteristic impedance value $Z_L$ is greater than the impedance value of the reference impedance Rs, the impedance value of the correction impedance Rd is increased to approximate the characteristic impedance value $Z_L$; and on the contrary, if the characteristic impedance value $Z_L$ is smaller than the impedance value of the reference impedance Rs, the impedance value of the correction impedance Rd is reduced to approximate $Z_L$.

Figure 3:
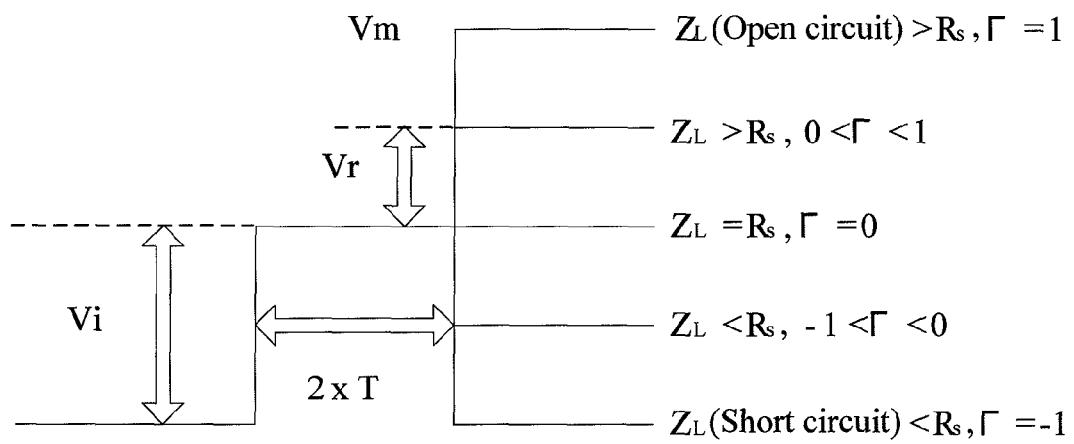
FIG. 3 is a schematic view of a waveform measured by a Time Domain Reflectometry (TDR) method.

Please refer to FIG. 3, which is a schematic view of a measured waveform using the method disclosed in another embodiment of the present invention, which shows the relations between a reflection coefficient Γ and the characteristic impedance value $Z_L$ and the reference impedance Rs' impedance value $Z_o$. When $V_m = 2V_i$, $Z_L$ is open-circuited; when the measured $V_m = 0$, then $Z_L = 0$, namely short-circuited. And when the measured $V_m = V_i$, then $Z_L = Z_o$, namely the impedance matched. Therefore, the relation between $Z_L$ and $Z_o$ can be obtained through the measured values of $V_m$ and $V_i$. The impedance calculation unit 106 can obtain $Z_L$ by the method.

Figure 4:
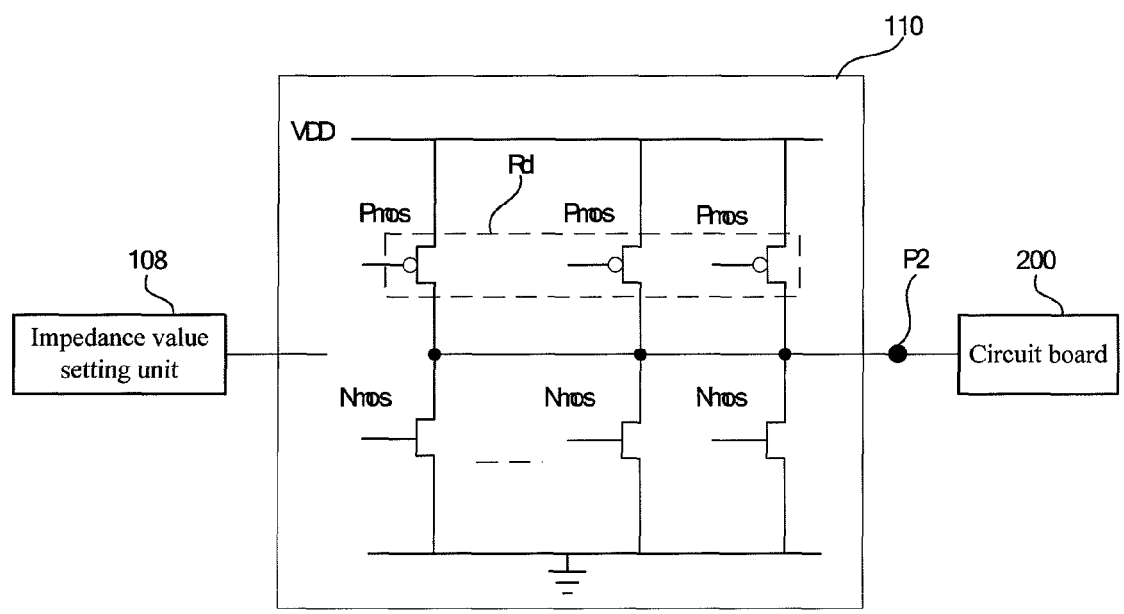
FIG. 4 is a schematic view of a driving unit according to another embodiment of in the present invention.

In an embodiment, the manner of setting the correction impedance Rd of the driving unit 110 is shown in FIG. 4. The driving unit 110 includes a voltage source VDD, and one end of the correction impedance Rd is coupled to the voltage source VDD. The correction impedance Rd of the driving unit 110 includes plural PMOS switches and plural NMOS switches, and one end of the PMOS switches is coupled to the voltage source VDD. The impedance value of the correction impedance Rd of the driving unit 110 is adjusted by controlling the number of turned-ON PMOS switches by the impedance setting unit 108. According to an equation VDD=I*Rd, where VDD is fixed, and I is determined by the number of turned-ON PMOS switches, the impedance value of the correction impedance Rd is changeable, which can also be referred to as driving force adjustment of the driving unit 110.

The correction impedance Rd may be adjusted in the following two manners.

1. The impedance value of the reference impedance Rs is adjustable, as the embodiment shown in FIG. 5. The impedance value of the reference impedance Rs is adjusted gradually according to a difference between a measurement signal and a step signal (that is, a difference between the characteristic impedance value $Z_L$ and the impedance value of the reference impedance Rs), until the reflected signal disappears, namely the measurement signal is equal to the step signal. At this moment, the impedance setting unit 108 sets the number of turned-ON PMOS switches of the correction impedance Rd according to the number of turned-ON PMOS switches of the reference impedance, so as to match the impedance value of the correction impedance Rd with the characteristic impedance value $Z_L$. In this embodiment, the reference impedance Rs includes plural PMOS switches and plural NMOS switches; and in different embodiments, a preset percentage may be selected to gradually adjust the impedance value of the reference impedance Rs corresponding to the difference between the measurement signal and the step signal.

2. The reference impedance Rs is a fixed value; and the method is to adjust by checking a comparison table of the number of turned-ON PMOS switches and the correction impedance Rd, as shown in the embodiment of FIG. 2. The comparison table can be obtained using the reference impedance Rs, and is stored in the impedance setting unit 108. For example, the reference impedance Rs and the correction impedance Rd are manufactured by the same process, and have almost the same characteristics. The reference impedance Rs may include at least one PMOS switch and at least one NMOS switch. Assuming that the reference impedance Rs is 50Ω and the number of turned-ON PMOS switches is 2, the impedance value of the correction impedance Rd would be 25Ω if the number of turned-ON PMOS switches is 4. In other words, after the characteristic impedance value $Z_L$ is obtained, the impedance setting unit 108 can find the correction impedance Rd closest to the characteristic impedance value $Z_L$ by looking up the table.

Furthermore, since the impedance correction device 100 is applied in a chip (integrated circuit), and the reference impedance Rs and the correction impedance Rd are manufactured by the same process, the process, temperature, and voltage drift characteristics of the reference impedance Rs and the correction impedance Rd are identical. Any person skilled in the art can certainly understand that the correction impedance Rd can also be implemented by NMOS switches.

Figure 5:
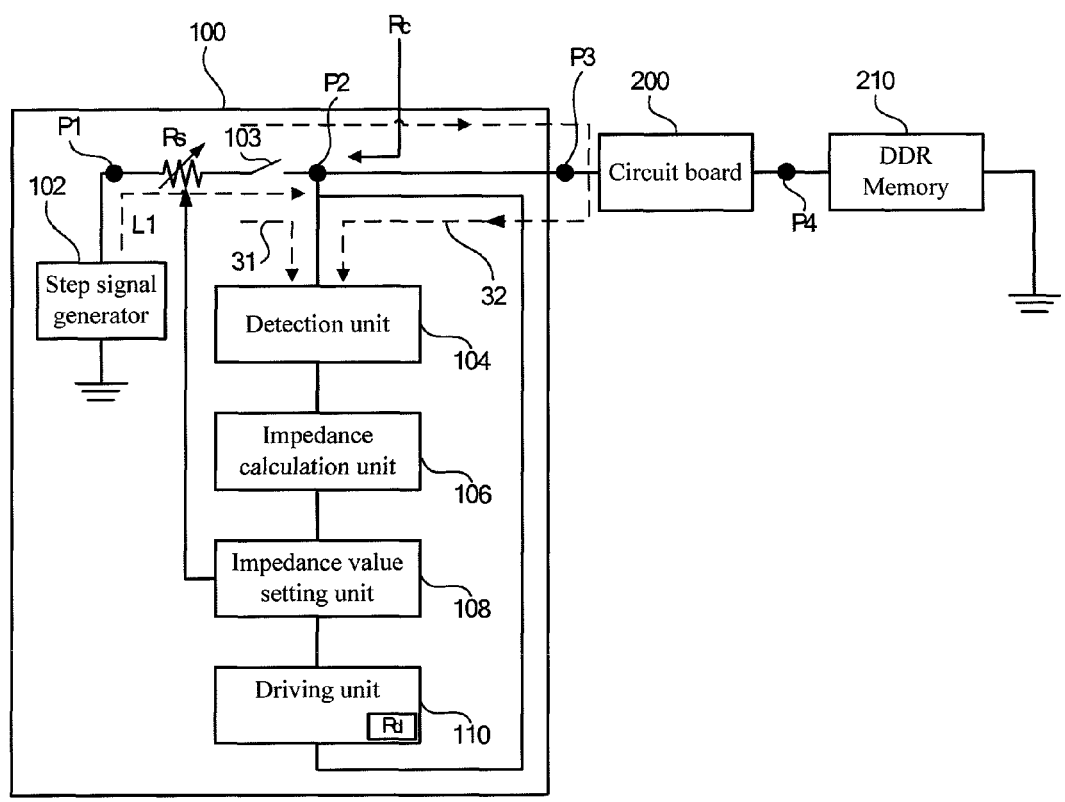
FIG. 5 is a functional block diagram of a impedance correction device according to another embodiment of the present invention.

The automatic impedance correction may be achieved using the impedance correction device 100 in FIGS. 2 and 5; furthermore, in the event that the same products of an external circuit device have different impedances due to problems such as process shift, difference of external voltages, change of environmental temperature, or variation of the circuit board, the effect of impedance correction can still be realized automatically so as to achieve better signal integrity. Therefore applying the impedance correction device 100 of the embodiments in the present invention can ensure stable quality without requiring additional external impedance adjustment or an external precision resistor, thereby effectively reducing the cost of production and testing.

Figure 6:
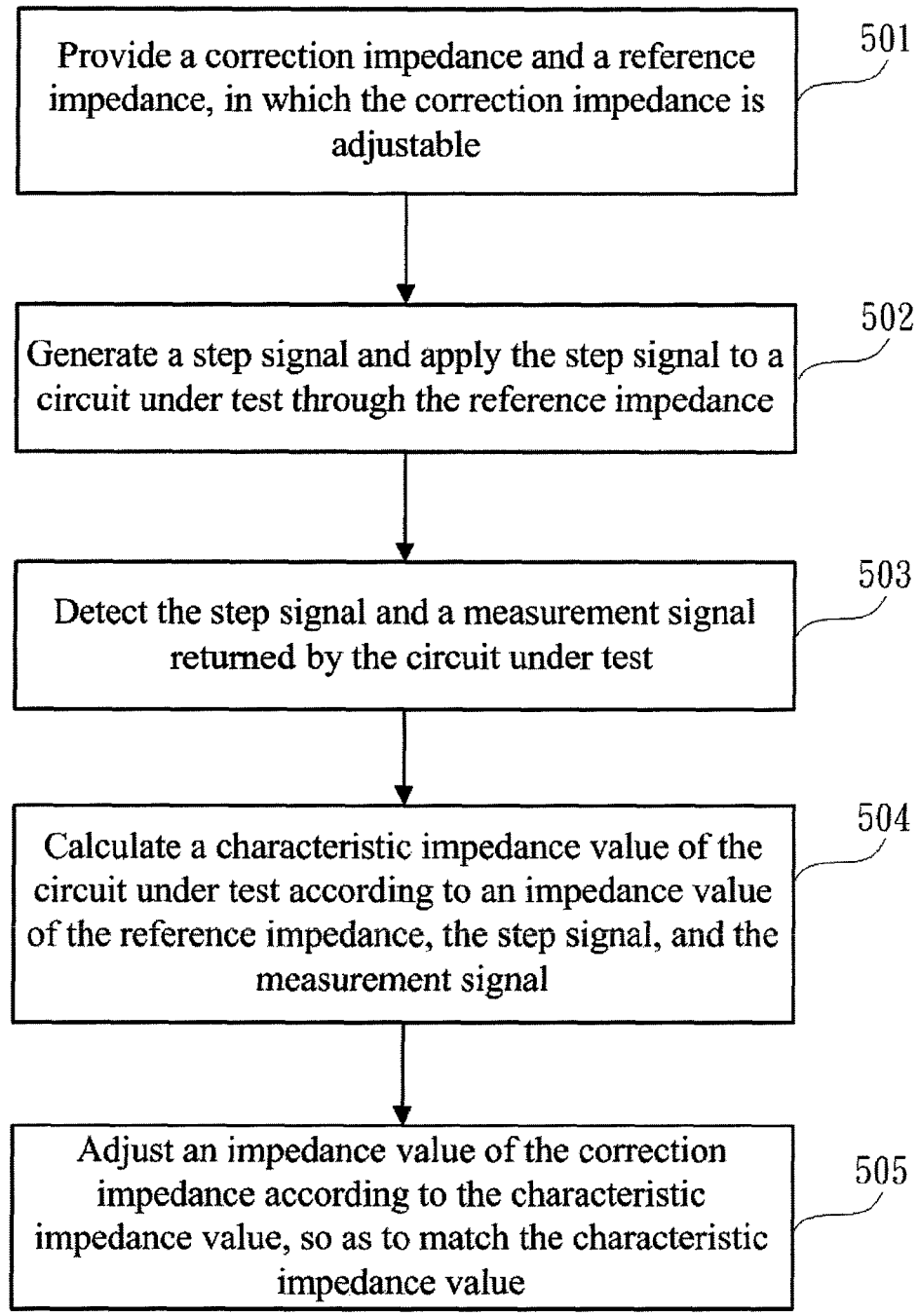
FIG. 6 is a flow chart of an impedance correction method according to another embodiment of the present invention.

Please refer to FIG. 6, which is a flow chart of a first embodiment of an impedance correction method in the present invention, which includes following steps.

In Step 501, provide a correction impedance and a reference impedance, in which the correction impedance is adjustable. For example, the correction impedance Rd of the driving unit 110 in FIG. 2 and the reference impedance Rs in FIG. 2 are provided.

In Step 502, generate a step signal and send to a circuit under test through the reference impedance; that is, the step signal is provided by the step signal generator 102 in FIG. 2.

In Step 503, detect the step signal and a measurement signal returned by the circuit under test. The step is performed by a detection unit 104 in FIG. 2.

In Step 504, calculate a characteristic impedance value of the circuit under test according to the impedance value of the reference impedance, the step signal, and the measurement signal. The step is performed by the impedance calculation unit 106 in FIG. 2.

In Step 505, adjust the impedance value of the correction impedance according to the characteristic impedance value, so as to match the characteristic impedance value. The step is performed by the impedance setting unit 108 in FIG. 2.

While the present invention has been described by the way of example and in terms of the preferred embodiments, it is to be understood that the invention need not to be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An impedance correction device coupled to a circuit under test, the impedance correction device comprising:
   a step signal generator, generating a step signal;
   a reference impedance, having one end coupled to the step signal generator and the other end coupled to the circuit under test;
   a detection unit coupled to the other end of the reference impedance and the circuit under test, detecting the step signal passing through the reference impedance and a measurement signal of the step signal after passing through the circuit under test;
   an impedance calculation unit coupled to the detection unit and the reference impedance, calculating a characteristic impedance value of the circuit under test according to an impedance value of the reference impedance, the step signal, and the measurement signal;
   a correction impedance, connected in parallel with the circuit under test;
   an impedance setting unit coupled to the impedance calculation unit and the correction impedance, adjusting an impedance value of the correction impedance to match the characteristic impedance value, when the characteristic impedance value is different from the impedance value of the reference impedance, when the reference impedance is adjustable, the impedance setting unit adjusts the impedance value of the correction impedance to match the characteristic impedance value according to a difference between the characteristic impedance value and the impedance value of the reference impedance, or when the reference impedance is set to a fixed impedance value, the impedance setting unit adjusts the impedance value according to a comparison table; and
   a driving unit having a voltage source and coupled to the impedance setting unit, wherein the correction impedance coupled to the voltage source.

2. The impedance correction device according to claim 1, applied in a chip.

3. The impedance correction device according to claim 1, wherein the impedance setting unit adjusts the impedance value of the reference impedance gradually according to a preset percentage.

4. The impedance correction device according to claim 3, wherein the preset percentage corresponds to the difference between the characteristic impedance value and the impedance value of the reference impedance.

5. The impedance correction device according to claim 1, wherein the reference impedance comprises a plurality of first transistor switches, and a number of the first transistor switches which have been turned on corresponds to the difference between the characteristic impedance value and the impedance value of the reference impedance.

6. The impedance correction device according to claim 1, wherein the impedance setting unit sets the impedance value of the correction impedance according to the impedance value of the reference impedance.

7. The impedance correction device according to claim 5, wherein the correction impedance comprises a plurality of second transistor switches coupled to the voltage source, and a number of the second transistor switches which have been turned on is according to the number of the first transistor switches which have been turned on.

8. The impedance correction device according to claim 1 further comprising a specific switch, wherein the specific switch is open to isolate influence of the reference impedance after the impedance value of the correction impedance is matched with the characteristic impedance value.

9. The impedance correction device according to claim 1, wherein the correction impedance comprises a plurality of transistor switches, and the comparison table comprises a corresponding relationship between a number of the transistor switches which have been turned on and the impedance value of the correction impedance.

10. The impedance correction device according to claim 9, wherein the reference impedance comprises at least one transistor switch to generate the impedance value of the reference impedance, and the comparison table is created according to the impedance value of the reference impedance and at least one of the number of the transistor switches which have been turned on.

11. The impedance correction device according to claim 9, wherein the reference impedance and the correction impedance are manufactured by the same process.

12. The impedance correction device according to claim 1, wherein the detection unit is selected from an analog-to-digital converter and a comparator.

13. An impedance correction method, comprising:
providing a correction impedance and a reference impedance, wherein the correction impedance is adjustable;
generating a step signal and sending the step signal to a circuit under test through the reference impedance;
detecting the step signal and a measurement signal returned by the circuit under test;
calculating a characteristic impedance value of the circuit under test according to an impedance value of the reference impedance, the step signal, and the measurement signal;
adjusting an impedance value of the correction impedance to match the characteristic impedance value in a parallel manner;
when the characteristic impedance value is different from the impedance value of the reference impedance, when the reference impedance is adjustable, adjusts the impedance value of the correction impedance to match the characteristic impedance value according to a difference between the characteristic impedance value and the impedance value of the reference impedance; and
when the reference impedance is set to fixed impedance value, adjusts the impedance value according to a comparison table.

14. The impedance correction method according to claim 13, wherein the impedance value of the reference impedance is adjusted gradually according to a preset percentage.

15. The impedance correction method according to claim 14, wherein the preset percentage corresponds to the difference between the characteristic impedance value and the impedance value of the reference impedance.

16. The impedance correction method according to claim 13, wherein influence of the reference impedance is isolated after the impedance value of the correction impedance is matched with the characteristic impedance value.

* * * * *